United States Patent [19]

Eichelberger et al.

[11] Patent Number: 5,214,655
[45] Date of Patent: May 25, 1993

[54] INTEGRATED CIRCUIT PACKAGING CONFIGURATION FOR RAPID CUSTOMIZED DESIGN AND UNIQUE TEST CAPABILITY

[75] Inventors: Charles W. Eichelberger, Schenectady; Kenneth B. Welles, II, Scotia; Robert J. Wojnarowski, Ballston Lake, all of N.Y.

[73] Assignee: General Electric Company, Schenectady, N.Y.

[21] Appl. No.: 784,094

[22] Filed: Oct. 28, 1991

Related U.S. Application Data

[63] Continuation of Ser. No. 363,646, Jun. 8, 1989, abandoned, which is a continuation of Ser. No. 912,457, Sep. 26, 1986, Pat. No. 4,866,508.

[51] Int. Cl.$^5$ ............................................. G01R 31/28
[52] U.S. Cl. ................................... 371/22.5; 371/22.3
[58] Field of Search ...................... 371/22.3, 22.5, 22.1

[56] References Cited

U.S. PATENT DOCUMENTS

| | | | |
|---|---|---|---|
| 3,723,868 | 3/1973 | Foster | 371/22.1 X |
| 4,357,703 | 11/1982 | Van Brunt | 371/22.5 |
| 4,701,920 | 10/1987 | Resnick et al. | 371/22.5 |

OTHER PUBLICATIONS

Mendelsohn, A., "Self-Testing ICs Begin to Emerge-Tentatively", *Electronics*, Feb. 24, 1986, pp. 33-36.
Anon., "Checking Out VLSI with Standard Test Gear", *Electronics*, May 26, 1986, pp. 33-35.
Stolte, L. et al., "Design for Testability of the IBM System/38", *Dig. 1979 Test Conf.*, IEEE, pp. 29-36.
Tendolkar, N. et al., "Automated Diagnostic Methodology for the IBM 3081 Processor Complex", *IBM J. Res. Develop.*, vol. 26, No. 1, Jan. 1982, pp. 78-88.
Baran, D. et al., "HC20000:A Fast 20K Gate Array with Built-In Self Test and System Fault Isolation Capabilities", *Proc. IEEE 1986 Custom IC Conf.*, May 12-15, pp. 315-318.
Horowitz, P. et al., *The Art of Electronics*, 2nd ed., Cambridge University Press, 1989, p. 488.
N. H. E. Weste & K. Eshraghian, "Principles of CMOS VLSI Design, a System Perspective", Subchapter 6.5.5 Structured Design for Testability, pp. 264-266, Addison-Wesley Pub. Co. 1985.
E. B. Eichelberger & T. W. Williams, "A Logic Design Structure for LSI Testability", from Proc. 14th Design Automation Conf., 1977, IEEE, pp. 462-468.

*Primary Examiner*—Stephen M. Baker
*Attorney, Agent, or Firm*—Marvin Snyder

[57] ABSTRACT

A packaged electronics system, having respective portions each with respective input and output ports, and having interconnection busses between certain of these ports, is tested as follows. Each input port has a set of first transmission gates associated therewith for selectively disconnecting it during testing from the end of each interconnection bus connected bit during normal operation. Each input port has a second set of transmission gates associated therewith for selectively applying test vectors thereto during testing as provided in parallel form from a serially loaded shift register. Each output port connects to the input connections of a respective set of tristate drivers for selectively applying its output signals at relatively low source impedance to at least one interconnection bus connected from the output connections of that set of tristate drivers. A shift register converts the signals appearing in parallel at least one end of each interconnection bus to a concatenation of test results in serial form.

18 Claims, 5 Drawing Sheets

FIG. 1

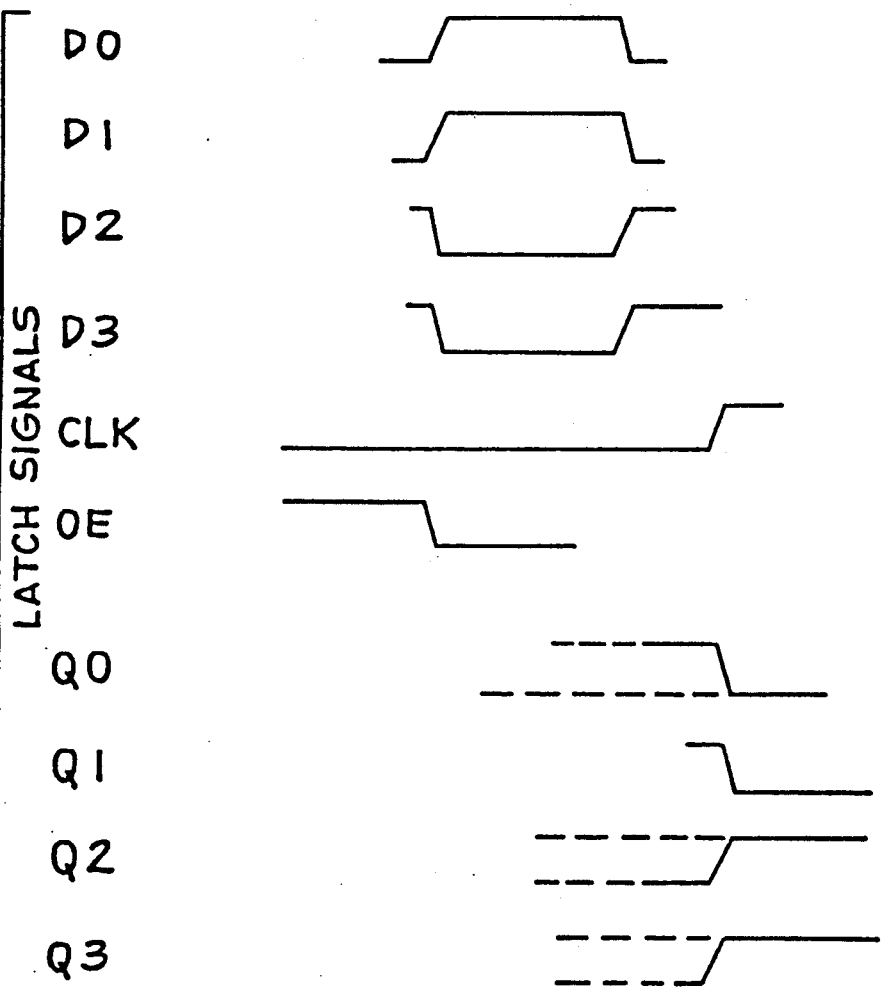

INTEGRATED CIRCUIT PACKAGING CONFIGURATION FOR RAPID CUSTOMIZED DESIGN AND UNIQUE TEST CAPABILITY

This application is a continuation of application Ser. No. 07/363,646, filed Jun. 8, 1989, now abandoned, which is a continuation of U.S. patent application Ser. No. 912,457, filed 26 Sep. 1986 issued 12 Sep. 1989 as U.S. Pat. No. 4,866,508.

BACKGROUND OF THE INVENTION

The present invention is generally directed to a packaging configuration for integrated circuit chips which guarantees routability of interconnection lines and which may be rapidly configured in accordance with a given engineering design. More particularly, the present invention is related to a packaging method in which polymer film overlays are provided with metallization patterns as a means for configuring an integrated circuit chip or chips in an operating arrangement which is customized, yet may be produced in a very short time, typically less than one day. The packaging configuration of the present invention also permits the utilization of a novel macrocell chip design which is particularly useful for the testing of chip functional blocks.

The generic problem to be solved herein is the fabrication of an electronic system from a given engineering design in an economical and expeditious fashion. A second, related problem is providing a method of testing which quickly isolates faults and provides a very high degree of assurance that the tests have been thorough and complete. The testing method should be done in an expeditious and economical fashion. Clearly, electronic systems have coped with these problems to a degree. Prior art systems include: interconnections of packaged chips by wire wrap and printed circuit techniques, gate arrays, programmable logic arrays and fully customized integrated circuit fabrication. Interconnecting packaged chips has been the main method to provide many electronic systems over the past twenty years. In the wire wrap method, sockets with wire wraps are provided, and logic chips to be interconnected are placed in these sockets. Subsequently, interconnections are provided by wrapping wires around wire wrap pins according to a wire list. This can be done by automatic or manual machinery. The major drawback of wire wrap is the length of time required to wrap a single board, which precludes this method being economic for any but prototyping applications. In addition, wire wrap boards cannot be checked for accuracy of wiring both in interconnects and shorts except by using expensive, dedicated machinery. Also, wire wrap provides a relatively low performance interconnect since runs are long and since they suffer from high capacitance loading effects. Once chips have been installed on a wire wrap board, it is difficult to partition the board for simple tests, and so testing to a high degree of functional assurance generally requires complex and time consuming testing apparatus. Finally, wire wrap prototyping boards are expensive because they contain a large number of holes and each wire wrap socket must supply long pins for wire wrapping.

Printed circuit boards are another method of interconnecting packaged chips. A printed circuit board typically comprises copper runs adhered to a glass-fiber/epoxy substrate. Packaged chips are mounted on the substrate and package pins are soldered to runs on the board. In terms of prototyping, the time from completion of the circuit definition until populated boards are received can be quite long. Layout for the printed circuit boards, if done by hand, can require two weeks to a month for a fairly complicated circuit board containing 100–200 chips. Even with computer aided layout, the amount of computer time required to route the board is substantial for a complicated board. In addition, complicated boards require multiple circuit layers, which makes design and fabrication of a printed circuit board a time consuming process. A typical short turn around time can be on the order of two weeks. In addition, special tooling must be provided in order to test that all the connections are made on the board and that no undesired short circuits exist. At this point it is still necessary to populate the board with chips and to solder them in place. Chip population is generally done in different plant locations than board fabrication because a large number of chips must be kept in inventory and are specific to the needs of a particular operating department, while board fabrication is more generic in nature. The problem of testing the finished assembly is the same as with a wire wrap method in that a fully interconnected assembly generally requires a large array of complex test vectors in order to derive a high degree of assurance that the system will work under all desired conditions.

A gate array is also a solution to the problem of providing an electronic chip system. A gate array is primarily a medium to high volume device. In the gate array, arrays of P-channel and N-channel transistors are fabricated in an array structure on integrated circuit wafers. These circuits are completely fabricated with the exception of the last metallization step. Logic designs are achieved by custom connecting the P-channel and N-channel transistors with the last metallization layer. This method makes relatively efficient use of silicon and utilizes computer aided layout directly from circuit definitions. Time is required to fabricate masks for the last metallization step and to finish the processing of the wafers. Typically the steps of automatic layout mask generation and chip fabrication require at least two weeks. At this point, thousands of chips can be relatively easily fabricated, but thousands of chips are generally not required for prototyping quantities and for many applications. To further complicate the problem, complete systems require custom testing by the vendor of the gate array before the chips can be packaged with the test vectors and conditions developed and supplied by the circuit engineer. This means that the circuit engineer must do sufficient simulation to develop a set of qualification test vectors. Further testing must be accomplished after prototype chips arrive at the circuit engineer's site. While simulation can greatly decrease the risk of design errors in the chips, it does not cover the operation of a chip in an electronic system substantially similar to its operating environment. Generally, faults will be found and updates will be necessary and the requirement for additional prototypes with more changes will be created. This process is costly and stretches the time to completion of a project substantially because each iteration requires at least two weeks. In addition, a single gate array cannot provide all the structures necessary for a complete electronic system. For example, voltages and current may not be compatible at the interface level and may require addition of bipolar devices for analog digital conversion at the input and for digital to analog conversion at the output.

Also, many systems require some form of memory. This means that the gate array would necessarily require an additional printed circuit board to interconnect the memory or interface devices.

A programmable logic array car be used to provide an electronic system economically in low volume for some applications. The major disadvantage of logic arrays is that they make inefficient use of silicon because the logic array must provide for all possible Boolean functions in "AND/OR" configurations. In those few applications where this type of Boolean logic is required the logic array can be programmed for the desired Boolean functions. Most systems, however, require a large number of logic arrays to achieve the desired function and this is not economical except possibly for the very first prototype.

Full custom integrated circuits can generally provide about two to three times the functionality available in the same area from a gate array, but the processing cost and non-recurring cost are substantially increased. Lay-out must now involve all layers of the chip and processing must also involve all layers of the chip. Three month turn-around times are typical for the processing associated with a fully custom integrated circuit chip. Test vectors and probe cards are also special. This means that substantial volume must be involved before the fully custom chip is economical. As a rule of thumb, volumes over 10,000 units per year are generally required.

The invention described herein also solves a slightly different problem with the same method and structure. In present day electronic systems, the primary components are usually readily available. These primary components include random access memory and microprocessor chip family sets as well as analog-to-digital and digital-to-analog conversion. In present day systems, these primary components are interconnected using TTL logic., As used herein, the term "TTL logic" or "TTL functions" refer to a set of functional blocks generally referred to as the 7400 series and described in the text "The TTL Data Book for Design Engineers" by Texas Instruments, Inc. This function of interconnecting, buffering and tying together the primary components of the system is generally referred to as a "glue logic function". For example, in present-day integrated circuit boards, one often finds certain standard functional chips surrounded by a plurality of custom interconnected integrated circuit chips in so-called DIP packages. It is these numerous small surrounding chips that provide a "glue function". In larger systems, the glue logic function may be provided by gate arrays and custom chips where a single chip replaces a large number of TTL chips. This leads to several problems. The first is that the number cf pins in the custom glue chip can be quite high. In addition, all of the primary components are immediately available. In the past, TTL was also immediately available and system interconnection could commence immediately on receipt of a given design. However, a time discontinuity now exists in which the primary components are available, but the custom glue logic takes many weeks to fabricate.

A problem solved by the invention in the parent patent application is defining a generic glue logic chip which can be used in place of a large number of conventional TTL logic chips. This glue logic chip is a multi-function digital circuit that includes a plurality of functional digital circuit blocks having input and output lines. Decoding means for selecting one of the functional blocks is also provided. Shift register means are also provided for storing test data and for storing output data from the output lines of the digital circuit blocks in response to test data presented. Such a multifunctional digit circuit may be repeated many times in a given integrated circuit package. Such a circuit is not only flexible, but is also readily testable both before and after customization.

The parent application describes how the fabrication of customized integrated circuit chips can be achieved with very fast turn around time by combining high density interconnect methods described in related patent documents (referred to below) with the novel glue logic integrated circuit. The integrated circuit is configured with a large number of small pads which are interconnected by the high density interconnect method. The chip is divided into a multiplicity of blocks which contain standard TTL functions such as latches, counters, gates, adders, etc. On-chip switches provide the ability to select a given logic function. A novel shift register circuit provides connections to all inputs and to all outputs on the chips for the purpose of testing. Testing can be accomplished both at the wafer level and uniquely at the system level where simple selection of switches can test any logic and any interconnects for opens and shorts. Blocks of logic elements and selection switches are iterated many times on a single chip. Using this configuration, a single chip which is 128 mils on a side, can replace the function of fifty logic chips and, additionally, provide capability for testing each separate logic block together with the capability for testing all system wiring for proper connection and freedom from short circuits.

SUMMARY OF THE INVENTION

The invention is embodied in apparatus for testing a package electronics system, having respective portions each with respective input and output ports, and having interconnection busses between certain of these ports, as described in the remainder of this paragraph, as well as in methods for operating such apparatus. Each input port has a set of first transmission gates associated therewith for selectively disconnecting it during testing from the end of each interconnection bus connected to it during normal operation. Each input port has a second set of transmission gates associated therewith for selectively applying test vectors thereto during testing, as provided by means for converting test vectors supplied in serial form to parallel form. Each output port connects to the input connections of a respective set of bistable drivers for selectively applying its input signal at relatively low source impedance to at least one interconnection connected from the output connections of that set of bistable drivers. Means are provided for converting signals, appearing in parallel at least one end of each interconnection bus, to a concatenation of test results in serial form.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a schematic plan view illustrating the placement of functionally flexible and testable circuits on a single die;

FIG. 5 illustrates a timing diagram for a sample test sequence used in the present invention.

DETAILED DESCRIPTION OF THE INVENTION

Figure 2:
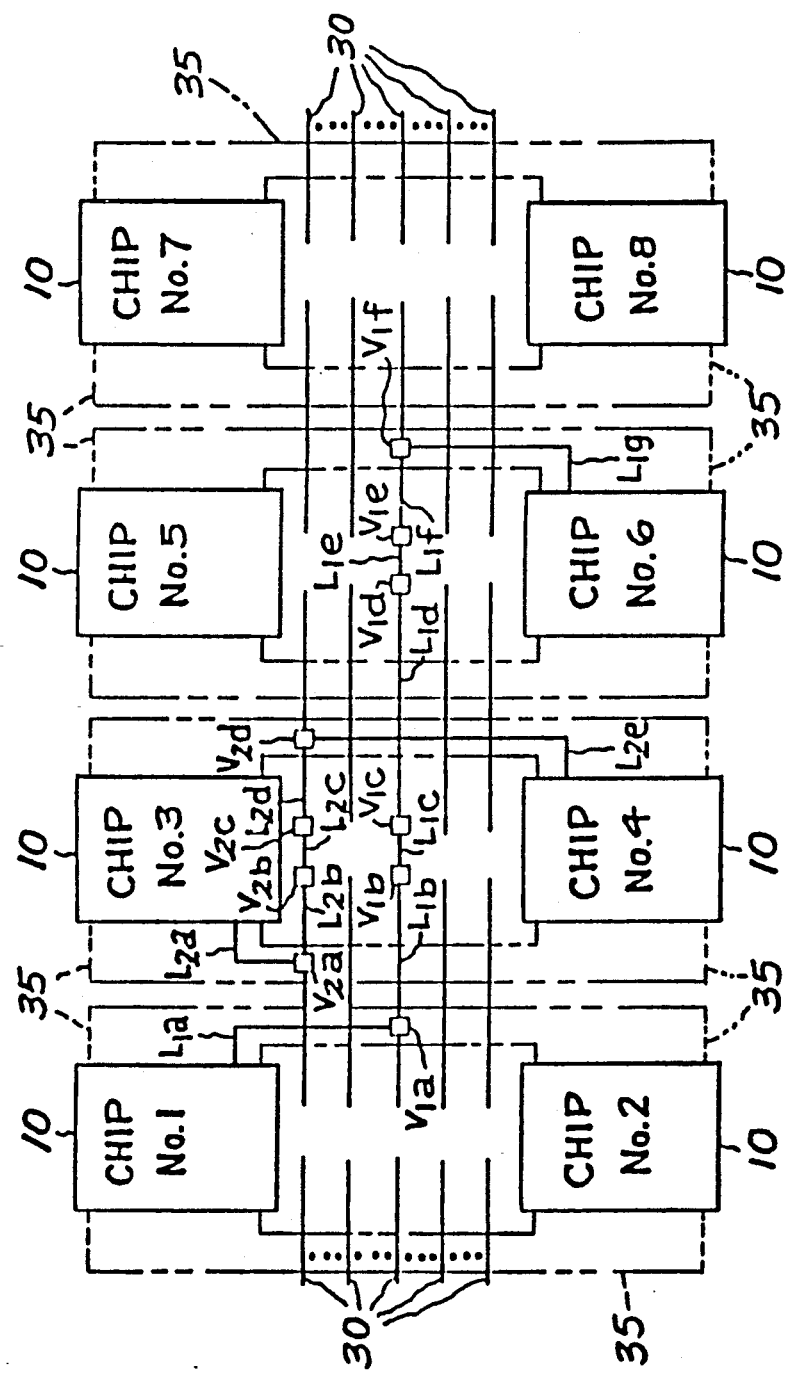
FIG. 2 is a schematic plan view illustrating a packaging and routing package configuration in accordance with the invention in the parent application.

It is easier to understand the present invention if it is first made clear how this invention is related to the high density interconnect system, as described in U.S. patent application Ser. No. 912,454, now abandoned, and Ser. No. 912,458, now abandoned, filed 26 Sep. 1986 by the present inventors and respectively entitled "METHOD AND APPARATUS FOR PACKAGING INTEGRATED CIRCUIT CHIPS EMPLOYING A POLYMER FILM OVERLAY LAYER" and "METHOD AND CONFIGURATION FOR TESTING ELECTRONIC CIRCUITS AND INTEGRATED CIRCUIT CHIPS USING A REMOVABLE OVERLAY LAYER"; U.S. Pat. No. 4,714,516 issued to R. J. Wojnarowski and C. W. Eichelberger, 22 Dec. 1987 and entitled "METHOD TO VIA HOLES IN POLYMER DIELECTRICS FOR MULTIPLE ELECTRONIC CIRCUIT PACKAGING"; U.S. Pat. No. 4,783,695 issued 8 Nov. 1988 to the same inventors and entitled "MULTIPCHIP INTEGRATED CIRCUIT PACKAGING CONFIGURATION AND METHOD". These applications and patents are hereby incorporated herein by reference. In the high density interconnect system as described in the aforementioned patent applications assigned to the same assignee as the present application, semiconductor circuit chips are mounted on a substrate, and subsequently covered with an overlay layer. Interconnections are made from chip to chip, within chips and from chips to package pins by providing via holes through the overlay layer to chip pads and by patterning metallization above the via holes to provide the desired interconnections. The high density interconnect method allows a higher density of interconnections to be made between chips than has been heretofore available. Typical numbers are between one-half and one mil per line and between one-half and one mil for the diameter of via holes. In addition, methods have been disclosed whereby the conductor patterning and via holes are directly defined by a laser under the control of a computer. As such, it is possible to custom define each electronic structure with virtually no additional effort above making the same structure on a repeated basis. This ability to custom define electronic structures leads to new opportunities in prototyping and in the production of both low volume and high volume electronic systems. In the parent invention, virtually all customization occurs in a single overlay metallization layer. This leads to very desirable situations in the area of special purpose custom chips. Firstly, the high density interconnect method takes full advantage of special purpose custom chips which provide conventional logic functions, thus making it possible to product interconnected electronic systems of high performance which are fabricated economically in prototype form and also to produce relatively low volume quantities of these systems. Alternatively, the utilization of a high interconnect density generic logic chip takes significant advantage of the high density interconnect method by providing the so-called "glue logic" function in which primary components such as memory and microprocessors are logically interconnected.

Figure 1:
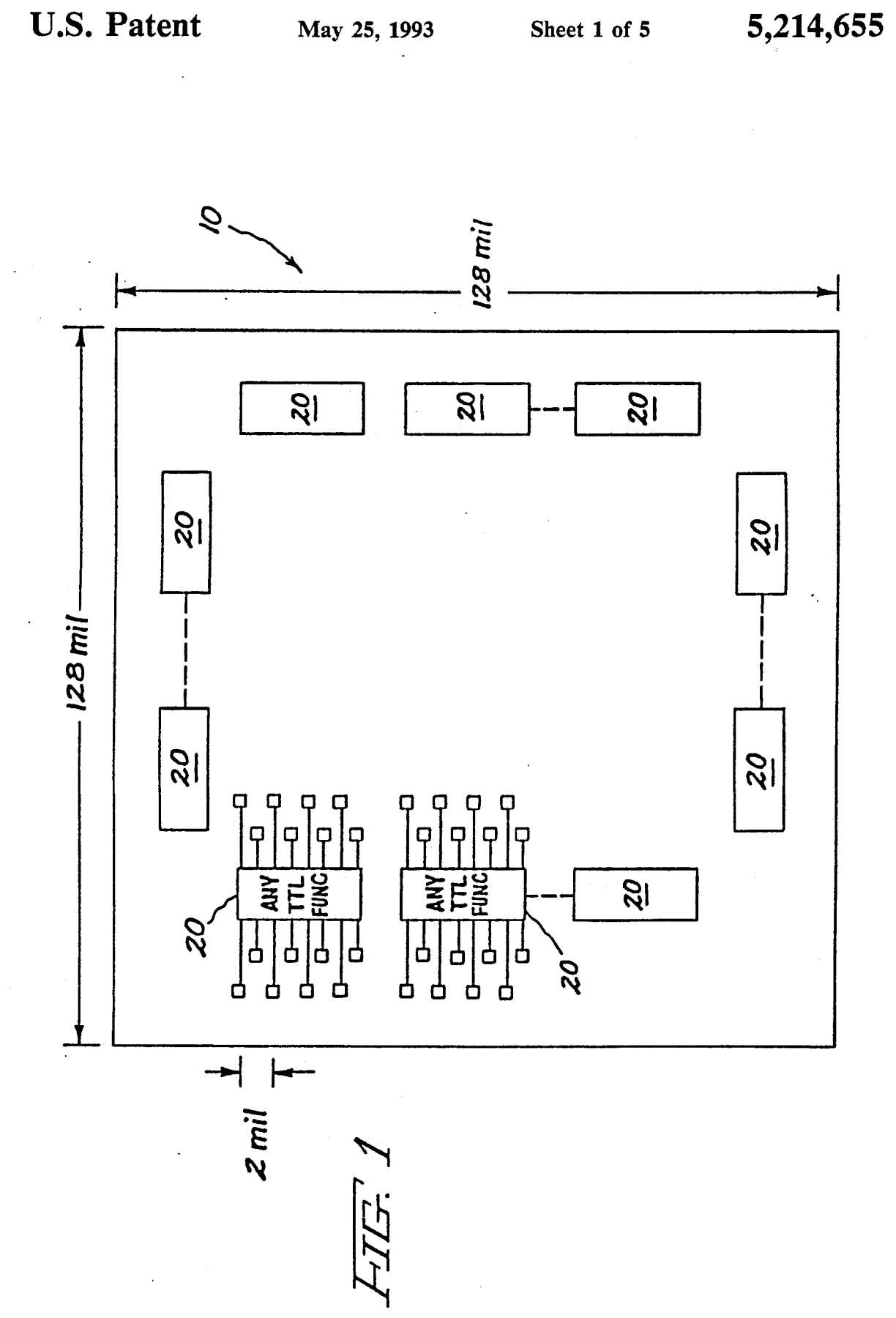

FIG. 1 shows a functional equivalent of a block diagram of a customizable integrated circuit chip 10. A basic block 20 is repeated a number of times and includes a number of input pads and output pads connected to a functional block which can provide virtually any TTL function. It is noted that chip 10 in FIG. 1 is merely a functional diagram. While the chip pads are preferably arranged on the chip in a regular order, it is not necessary that they be configured as shown in FIG. 1. In particular, FIG. 1 should not be read as suggesting that the central area is devoid of circuitry or chip pads. FIG. 1 is merely illustrative of the fact that chip 10 may be provided with a plurality of duplicate functional blocks 20. Blocks 20 are essentially independent entities, except perhaps for power connections. A preferable circuit for functional block 20 (in the context of providing a glue logic function) which implements the invention, is discussed below with specific reference to FIG. 4.

To estimate the number of equivalent TTL packages which could be accommodated on a single chip, a 2 mil spacing between pads is assumed. As indicated, solely for the purpose of example, it is also assumed that chip 10 is 128 mils on each side., Accordingly, sixty-four equivalent TTL packages could be derived from this single chip. This further assumes the utilization of approximately eight out of sixteen of the pads associated with each functional block 20. This results in a total of approximately 512 pads per chip. As used herein and in the appended claims, the term "pad" refers to a conductive area on an integrated circuit chip specifically designed and positioned for interconnection to other circuit elements. It is also noted that in conventional integrated circuit chip design, the pads are typically positioned around the periphery of a chip., However, the high density interconnection method is particularly amenable to the placement of interconnect pads anywhere on the chip.

FIG. 2 shows a layout of eight of the chips from FIG. 1 on a substrate approximately 2 inches on a side. In particular, it is seen that chips 10 are preferably configured so as to define a horizontal channel in which periodically interrupted conductors 30 are disposed. Similarly, vertical wiring is typically disposed within regions 35 defined by phantom lines as shown. It is also to be particularly noted with respect to FIG. 2 that it represents a multilayer circuit in accordance with the high density interconnect method described in the incorporated references.

FIG. 2 is also important in that it shows that 100% connection routing is achievable. This is important because it guarantees that a computer can always complete routing once the circuit definition is provided. In this specific example, a substantial portion of the system is fabricated before the actual circuit is known. In this example embodiment, all custom interconnection is done with one metallization layer. Main channel wiring 30 comprises conductors disposed on 1 mil (for example) centers oriented horizontally as shown. These conductors are interrupted as shown in the diagram between each pair of chips mounted on the substrate. This is a preferred embodiment. However, it is noted that the main channel wiring does not have to be straight nor do chips have to be disposed in pairs. Main channel wiring 30 is, however, preferably disposed on the same substrate as chips 10.

After chips 10 are mounted, an overlay layer (not shown specifically in FIG. 2) is applied. Via holes are fabricated over select pads on chips 10 and over the desired interconnect lines in the main channel section of the substrate. Details of these processes are contained in the incorporated references. Via holes also fabricated on the ends of the main channel interconnect conductors 30 where it is necessary to continue a given conductor to the next pair of chips. Metallization is now applied and patterned. The interconnect lines can be brought out in an orderly fashion as shown in FIG. 2. Although only a few lines are shown for clarity, it can be seen that connections can be made to all pads of a given functional equivalent block on each chip. Further, each functional equivalent block can be connected to any other functional equivalent block on the same chip or on any other chip in the system.

Two completed interconnections are shown in FIG. 2 with the specific conductor runs shown more darkly. For example, it is seen in FIG. 2 that a connection is made from a chip pad on chip No. 1 through a via opening in the overlay layer (not shown) to vertically disposed conductor $L_{1a}$ which extends over the overlay layer (not visible) to via opening $V_{1a}$ and down therethrough to main conductor segment $L_{1b}$ (part of channel wiring 30) which extends horizontally at the substrate level to via opening $V_{1b}$ wherein metallization pattern $L_{1c}$ connects thereto through via opening $V_b$. Conductive pattern $L_{1c}$ is disposed on the overlay layer and extends between via openings $V_{1b}$ and $V_{1c}$ so as to link main wiring segments $L_{1b}$ and $L_{1d}$. Line $L_{1d}$ extends to via opening $V_{1d}$ in the overlay layer and thereby connects to link $L_{1e}$ disposed on top of the overlay layer and connecting segment $L_{1d}$ with $L_{1f}$ by means of customizing link $L_{1e}$. Segment $L_{1f}$ extends from via opening $V_{1e}$ to via opening $V_{1f}$ at which point it connects to vertically oriented metallization line pattern $L_{1g}$ disposed on the upper overlay layer and connects to a select pad on chip 6. Thus, a customized link is established between chip No. 1 and chip No. 6 solely by the customized metallization pattern appearing on the overlay layer. Thus, the overlay layer metallization typically includes vertical links such as $L_{1a}$, $L_{1g}$ (and for linking chips 3 and 4, vertical segments $L_{2a}$ and $L_{2d}$). The overlay layer also includes horizontal links, such as $L_{1c}$ and $L_{1e}$, which serve to bridge selected interruptions in main channel wiring segments 30. Also for illustration, a second customizing link is also shown between chips 3 and 4. This link includes vertical segments $L_{2a}$ and $L_{2d}$ together with horizontal bridge $L_{2c}$ disposed on the customizing metallization layer. Similarly, this second example link also includes horizontal main wire segments $L_{2b}$ and $L_{2e}$. While it might first appear that link $L_{2c}$ and link $L_{1d}$ intersect so as to cause an undesired connection, it is noted that these two conductors are actually disposed on different layers which are insulated from one another. In particular, $L_{1d}$ is preferably disposed on the substrate layer while vertical link $L_{2e}$ is disposed on the customizing or overlay layer.

In the exemplary embodiment shown, there are approximately 500 pads on each chip and there are eight chips shown. Since for each connection there must be a source and destination, the total number of interconnections will be one-half of $8 \times 500$ or approximately 2,000 interconnections. In order to avoid any possible contention, the main channel need only be 2 inches wide. This width assumes a 1 mil conductor pitch for purposes of example. It is also seen that the distance between adjacent chips need only be 0.5 inches, also assuming a 1 mil conductor pitch since each chip has a total of 5123 total chip pads, so that one-half of those would come out on each side. This space is more than ample, since approximately 128 conductors for each chip arise from the bottom of the chip. The extra space available may be used to route the wiring which connects to the pins of the package.

Figure 3:
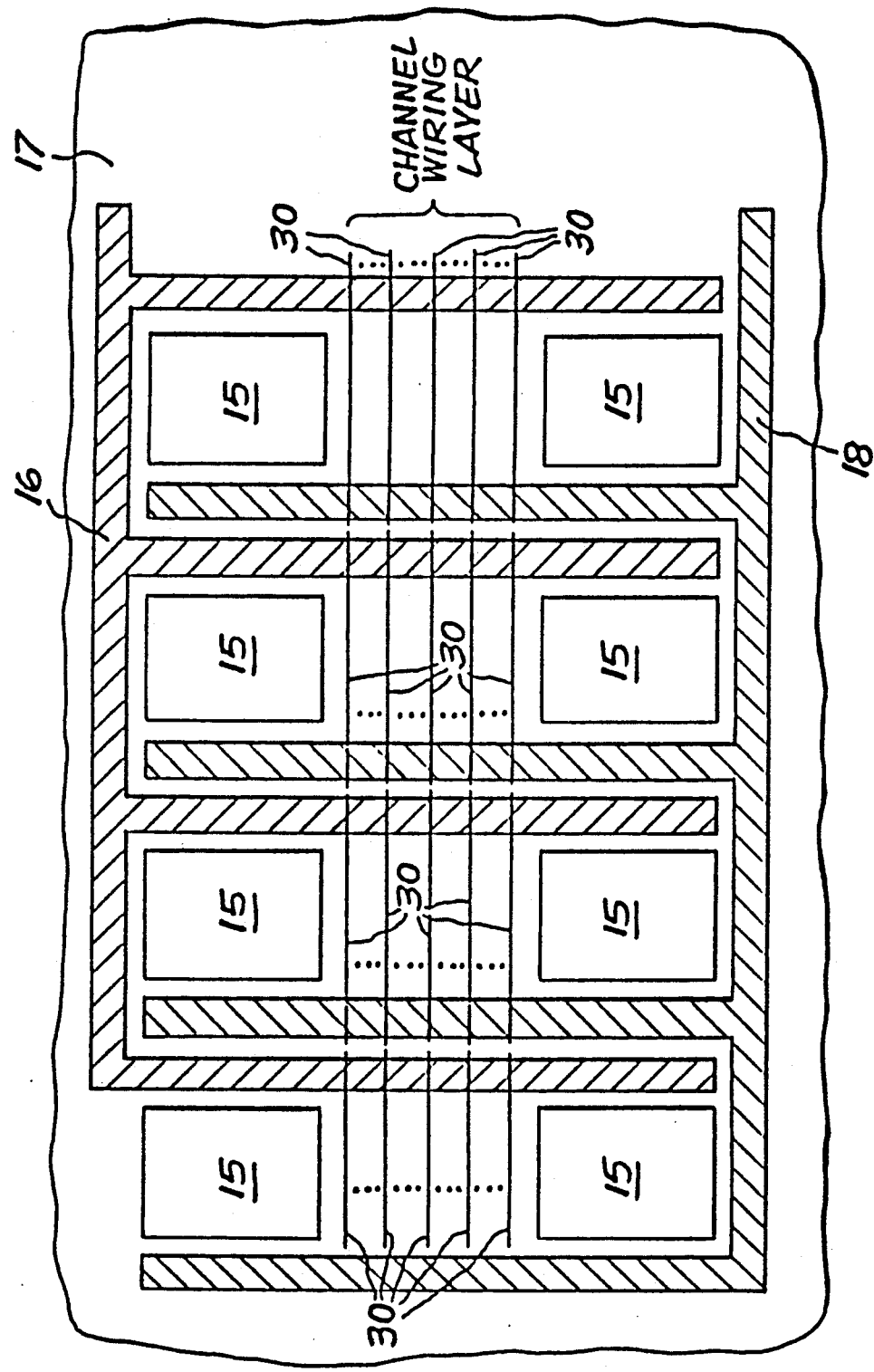
FIG. 3 is a view similar to FIG. 2 but more particularly illustrating the placement of power busses on a lower level.

Much of the package shown in FIG. 2 can be prefabricated as shown in part in FIG. 3. FIG. 3 shows the assembled package with main channel wiring 30, power supply wiring busses 16 and 18 and chip package wells 15. An insulating spacer is made of ceramic punched in the green state or laser cut to provide wells 15 for the chips. The top surface of ceramic 17 is metallized by direct-bond copper methods or other conventional means for metal deposition on ceramic. Power supply busses 16 and 18, as shown, are provided either by etching or are built up by semi-additive printed circuit methods which are well known in the art. Subsequently, a layer of polymer, for example DuPont Pyralin TM polymer is sprayed and cured on the ceramic. Vacuum deposition methods may be used to apply metallizaation and ordinary photolithographic methods are employed to pattern the metallization to form main channel conductors 30. Then, the package is ready for the addition of chips 10 into wells 15. At this point, a polymer film overlay may be provided as described in the incorporated references. The resulting structure is now ready for metallization and customizing as described above.

Thus far, a structure and method have been described which can interconnect any logical function block on any of eight integrated circuit chips. More or fewer chips may be accommodated by varying the size of the main channel and the vertical channels. In this description, only a single layer of metallization is required to customize the interconnections and, additionally, the wiring is highly structured and defined, with the exception of the definition of which pads in the given logic block or chip will be connected, and with the exceptions as to which conductor in the main channel is used to complete the connection from a given source to a given destination. This, however, is a very straightforward routing problem which is readily solved with an absolute minimum of computer time. In fact, with the appropriate dimensions and number of main wiring segments, it is merely a matter of assigning the segments to a given connection path.

A structure is described above in which integrated circuit chips of very high pad density are interconnected. The discussion below now focuses on a method and structure for building an integrated circuit which can be interconnected by the method disclosed above and which provides the functional equivalent of virtually any TTL logic function. In addition, each such logic block on a chip can be individually tested, both at the wafer stage and after interconnection in an electronic system, as provided for by the present invention. Further, the integrated circuit presented allows complete testing of all interconnections for short and open circuits, again as provided for by the present invention.

Figure 4:
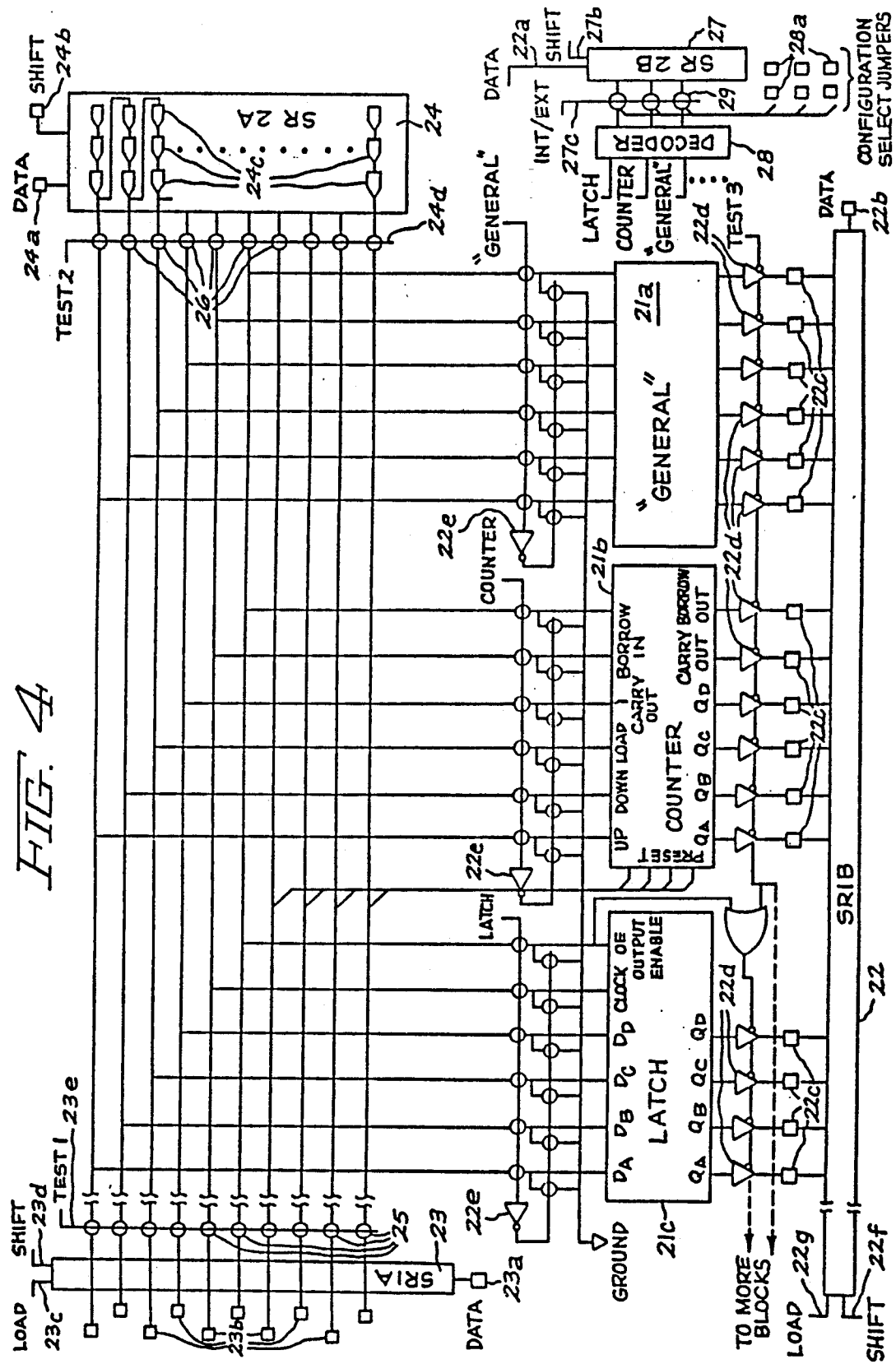
FIG. 4 is a schematic diagram illustrating a general block diagram of a repeatable logic structure for the functional blocks shown in FIG. 1 useful in implementing the present invention.

FIG. 4 shows a block diagram illustrating a single functional block 20. It should be noted that this functional block can be repeated as many times as the size of the chip allows. With each repetition, a totally new logic function is available for interconnection in an electronic system.

In the diagram of FIG. 4, all input pads are isolated from the rest of the circuit by transmission gates such as gates 25, 26 and 29. Each set of transmission gates is controlled by a single test line. For example line 23e for TEST1 or line 24d for TEST2. The test involved with these lines is more particularly described below.

In normal operation, transmission gates 25 connect input pads 23b to the appropriate internal circuitry. During test mode, the input pads are isolated and internal circuitry is used to exercise the appropriate function block. In this embodiment, shift register SR2A (reference number 24) is used to supply test signals and shift register SR1B is employed to receive output signals (shift register SR1B is designated by reference number 22) for use in testing and configuring each of the function blocks 21a, 21b, 21c etc. For example, in the test mode, the output of shift register SR2A is connected so as to internally supply test vectors to the appropriate logic function. When the inputs are disabled, shift register SR1A is connected to receive signals on the same set of lines and transmit these signals to pad 23a which also functions as a means for providing test signal output. Shift register SR1B, designated reference number 22, is connected to receive outputs from each of the individual function blocks and to transmit these signals to a test point (pad) 22b. A logic function is selected by turning on the appropriate group of selection gates. Each group of selection gates associated with each logic function is connected to a decoder 28. Decoder 28 is addressed either by connection to shift register SR2B (reference number 27) or by connection to jumpers which bridge configuration selection pads 28a. These jumpers are wired when the customizing interconnection wiring is patterned. Note that when a particular logic function is not selected, minimum sized NMOS devices are gated on through inverters 22e to hold all of the inputs of that device at ground and therefore, at minimum power consumption. It is also noted that the three functional blocks illustrated in FIG. 4 represent only three of eight possible blocks which may be selected through decoder 28. In particular, FIG. 4 shows the inclusion of latch block 21c, counter block 21b and a block denoted "general" designated by reference numeral 21a. Other blocks which may be employed include adders, subtractors, multiplexers, multipliers and the like. Typically, such blocks are selected from the so-called 7400 series of logic functions.

The circuit of FIG. 4 shows some sample logic functions interconnected according to the parent invention. The actual logic functions in the labeled boxes are well known in the art and accordingly, their implementations need not be provided herein. In FIG. 4, there is shown general box 21a which represents any desired logic function. Examples of other logic functions which fit the format of the general box also include flip flops and decoder configurations. It should be noted that logic functions such as latches, counters, adders, decoders, etc. are relatively simple functions on a per bit basis and therefore, in the example of a 128 mil square chip, as many as sixteen different logic functions can be accommodated in one repeatable logic block. It is also noted that the listing given above incorporates more than 90% of the total logic functions available in the so-called 7400 logic series. It should also be noted that other logic functions not described can be incorporated into the format shown with different mixes of logic function and with different numbers of bits. The present invention relates also to a method and structure of selecting a particular logic function and of interconnecting these logic functions according to a custom interconnection pattern. Note that part of the custom interconnection includes selection of the configuration and application of 1 or 0 logic level to the appropriate preset and configuration nodes on the logic element.

The embodiment of the present invention shown in FIG. 4 presents a unique testing capability. Each shift register shown in the function block of FIG. 4 is repeated as the function blocks are repeated. As many shift registers as desired can be coupled in series such that only a data and shift clock pad are necessary for shift registers where data is shifted into a shift register. DATA, SHIFT and LOAD pads are necessary where data are loaded in parallel into a shift register and then are shifted out. As a result, only five pads are necessary to control the data to any given shift register chain. As a practical matter, a typical configuration involves chaining together the test shift registers for all the blocks on one side of a chip resulting in four sets of shift registers. To test the circuit, data are loaded into shift registers SR2A and SR2B. Shift register SR2A selects the test pattern and shift register SR2B selects the block to be exercised. Shift register SR2A is arranged to be of a type that will temporarily store m n-bit vectors simultaneously, where m and n are integers greater than one which integers may or may not be different from each other. The integers m and n are three and ten, respectively, in shift register SR2A as shown particularly in FIG. 4. Each test vector stored in shift register SR2A is ten bits wide. Three ten-bit test vectors can be loaded bit serially, time-division multiplexing between them at bit rate. Thereafter, a succession of three ten-bit-wide test vectors can be sequentially supplied by clocking forward three stages for each test event. This allows the shift register to be clocked in rapid succession and to provide a dynamically changing sequence for the purpose of testing propagation delays and responses to clock edges. A LOAD pulse on shift register SR1B loads the output of the logic function from tristate latches 22d into shift registers SR1B. At this point, shift register SR1B contains the resultant output response of the selected logic function corresponding to the transient test vector applied by shift register SR2A.

FIG. 5 shows a timing relation for a test of the latch function in FIG. 4. Bits D0 and D1 are toggled from a 1 to a 0, while bits D2 and D3 are toggled from a 0 to 1. When this test is executed, shift register SR2A is clocked to set the D0 through D3 bits. After a settling time, the shift register is clocked rapidly two more times, first to set the data into the latch and second to control the latch. After the propagation delay time of the latch has passed, the data appears at the output of the latch and is loaded into shift register SR1B. Shift register SR1B can then be "read out" and its contents compared with the expected results. Clearly, if the same test vector is shifted into the equivalent shift register SR2A in each function block, all latches in all function blocks are tested simultaneously with a test that considers both logic function and propagation time. Responsive to a LOAD signal applied to the respective shift registers SR1B for the function blocks, which are connected as serial portions of an extended shift register, the bits in the result of simultaneously testing each latch are loaded in parallel into a corresponding portion of the shift register SR1B for the function block in which that latch is located. The serial test results read from the final DATA output pad of this extended shift register are a serially read sequence of the test results that were loaded in parallel into the respective shift registers SR1B for the function blocks responsive to the LOAD signal. Probe testing is essentially accomplished in this manner with a very few number of probes connected to the appropriate shift and load pads for the number of shift registers chained together. In the example presented, this could comprise a group of four shift registers. Testing proceeds by testing all the necessary test vectors for each logic function in a logic block. It should be noted that not all logic functions on the chip need to work for the chip to be fully utilized. For example, if the preset counter fails the tests, but the latch is working, then this function block can be used in any system where a latch is required. It should also be pointed out that not all function blocks need to be utilized. In some of the logic functions, more pads are required than are allowed by the pitch of the interconnect wiring. It is necessary then, when such a logic function is used, to skip the next function block or to use it in a mode where very few of the pads are used. A very simple strategy is to assume that one of every five function blocks will not be utilized. This allows space for extra wiring. It also allows selection of which of those function blocks is not utilized, to be made on the basis of which function block has failed in testing. It can be seen that the yield of usable chips is very high. This is due to the fact that the chip, as defined, is very small by present processing standards. In addition, because the chip is partitioned into repeating function blocks, chips containing bad function blocks can be utilized with virtually no penalty.

When chips are interconnected to an electronic system, the testing procedure is essentially the same. In this case, the configuration is defined by the interconnect wiring. Interconnects are provided to hardwire the inputs to the decoder. In addition, interconnects are provided which can tie together the input and output of the test shift registers and tie as many pads as necessary to external pins in the package. In this way, signals applied externally can be used to check for opens and shorts in all interconnects in the system. The procedure for checking for proper operation of a given logic function is the same as before. The test mode is selected by isolating the input pads with the transmission gate associated with them. Shift registers SR2A and SR2B are loaded and clocked as previously described with the resultant function output being loaded into shift registers SR1B. The contents of shift register SR2B are superfluous since the decoder is hardwired to select only one of the logic functions. After test vectors have been applied to ensure that all logic functions on all chips are operating satisfactorily, a wire check proceeds as follows: outputs are defined as sources and inputs as destinations. The strategy is to set one single source in the entire system to logic 1 while all other sources are set to logic 0. Then test all destinations to determine that the logic 1 appears only at the desired destination and at other point. This checks both for connectivity and for unwanted short circuits. The process is then repeated for the same source by setting the source to 0 and setting all other sources in the system to logic 1. Simple test vectors can be used and applied to each logic element in the system to provide the single 1, all 0 and single 0 all 1 outputs desired. A first portion of the packaged electronics system, which provides the sources for interconnect testing, receives respective values of TEST1 and TEST2 signals that render the first and second sets of transmission gates therein respectively non-transmissive and transmissive. This connects the input port of that first portion of the system to receive the test vectors in parallel form and disconnects that input port from each interconnect connecting thereto during times of normal operation. A second portion of the system, which provides the destinations for interconnect testing, receives respective values TEST1 and TEST2 signals that render the first and second sets of transmission gates therein respectively transmissive and non-transmissive. This connects the input port of the second portion of the system from each interconnect connecting thereto from the output port of the first portion of said packaged electronics system during times of normal operation, and this disconnects the input port of the second portion of the system for receiving test vectors. When the appropriate outputs are supplied, shift register SR1A is strobed, and thus captures the logic states at all destinations in the system. This logic state is ten clocked out and inspected to ensure that only the desired destinations are reached.

After all sources have been checked in the same way, the process is reversed. The drivers for all logic units are placed in their tristate output disable condition. The transmission gates which isolate the inputs from the given logic function are closed and shift register SR2A now acts as a source of data to the pads normally associated with inputs. Again, a single 1 is placed on a given destination pad with zeros on all other pads. Shift register SR1B is strobed so as to capture the logic state at all source pads. This secondary check looking backward through the system by supplying data at destination pads and observing it at the source pads, provides a complete check of all wiring in the system. It is important to note that the procedure outlined above is independent of the complexity of the circuitry which is formed by interconnecting the various logic function blocks. That is, the vectors required for a single 1 and all 0 from a particular logic function are always the same for that logic function and can be stored in a table. The wiring list which defines sources and destinations, is the schematic which was entered originally. It is then possible to guarantee that each functional logic block operates as desired and that all interconnections in the system, including those on the chip, are properly made without short circuits. This then provides a very high degree of assurance that the circuits function properly when the original logic is correct. Put ;another way, assuming the basic logic circuit is free from human logic error, any circuit tested for interconnect and logic block functionally performs the complex functions desired with a high degree of assurance.

Thus far, the structure described in a multiplicity of identical or nearly identical logic chips interconnected to form a complex electronic system. The chip described above can also be used in electronic systems which utilize primary electronic devices such as random access memory, microprocessor, and analog to digital conversion and the like. The specific structure described uses only one layer of metallization for interconnection because one layer can be applied and patterned in less time than additional layers. Additional layers can be used to increase packing density of the system and interconnect one or more of the chips described to use them as the glue logic in complex electronic systems.

The system of the present invention makes it possible to construct and test complex integrated circuit systems and electronic components in a reliable and highly efficient manner.

While the invention has been described in detail herein in accord with a certain preferred embodiment thereof, many modifications and changes therein may be effected by those skilled in the art. Accordingly, it is intended by the appended claims to cover all such modifications and changes as fall within the true spirit and scope of the invention.

What is claimed is:

1. Apparatus for testing a packaged electronics system including interconnection busses for connecting portions of said system to each other, said respective portions of said system each having a respective input port and respective output port to each of which ports one end of each of certain of those said interconnection busses connects during times of normal operation, said apparatus for testing comprising:

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a first external connection on the packaged electronics system for receiving test vectors supplied in serial form;

means included within said packaged electronics system for converting said test vectors supplied in serial form, as received through said first external connection during a time interval preceding a testing time interval, to n-bit-wide test vectors supplied in parallel form during said testing time interval, which said means is of a type that can be loaded during said preceding time interval to store temporarily therewithin at the same time m n-bit-wide test vectors and that can be unloaded during said testing time interval to supply said m n-bit-wide test vectors one after the other, wherein m is an integer greater than one and wherein n is an integer greater than one that is not necessarily the same as or different from m;

a respective second set of transmission gates associated with each said input port responding to a second test signal for selectively connecting that said input port to receive at least a segment of each of said n-bit-wide test vector from said means for converting said test vectors;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting, to a sequence of said test results supplied in serial form, the signals appearing in parallel from at least one end of each said interconnection bus; and a second external connection on the packaged electronics system for transmitting therethrough said sequence of said test results in serial form.

2. Apparatus for testing a packaged electronics system, as set forth in claim 1, wherein said means for converting said test vectors supplied in serial form to test vectors in parallel form includes a shift register connection of a plurality mn of clocked temporary storage stages arranged in a tapped delay line configuration having taps separated by m clocked temporary storage stages, whereby a succession m in number of n-parallel-bit test vectors can be supplied without reloading said shift register connection via the initial one of its mn clocked temporary storage stages.

3. Apparatus for testing a packaged electronics system, as set forth in claim 1, operated in accordance with a non-testing mode of normal operation of at least selected portions of said packaged electronics system, said method comprising the steps of:

applying a value of said first test signal to the respective first set of transmission gates associated with the input port of each normally operated portion of said packaged electronics system, which value conditions that respective said first set of transmission gates to connect its associated input port to each said interconnection bus its associated input port connects to during times of normal operation;

applying a respective value of said second test signal as conditions each second set of transmission gates associated with the input port of each normally operated portion of said packaged electronics system for disconnecting the input port for receiving test vectors from said means for converting said test vectors; and applying a respective value of said third test signal as conditions each set of tristate drivers associated with an output port of each normally operated portion of said packaged electronics system to apply the signal received at its input connections with relatively low source impedance as compared to that for another value of said third test signal.

4. Apparatus for testing a packaged electronics system, as set forth in claim 1, operated in accordance with a method to test the functioning of a portion of the packaged electronics system, said method comprising the steps of:

loading a plurality m in number of n-bit-long test vectors serially, via said first external connection on the packaged electronics system, into said means for converting said test vectors supplied in serial form to test vectors in parallel form;

applying a value of said first test signal to the respective first set of transmission gates associated with an input port of said portion of said packaged electronics system under test, which value conditions that respective said first set of transmission gates for disconnecting that said input port from each said interconnection bus connecting thereto during times of normal operation;

applying a value of said second test signal as conditions said second set of transmission gates associated with the input port of said portion of said packaged electronics system under test for connecting that said input port to receive said test vectors in parallel form as supplied by said means for converting test vectors in serial form to test vectors in parallel form;

applying a value of said third test signal as conditions said set of tristate drivers associated with an output port of said portion of said packaged electronics system under test to apply the signal received at its input connections to its output connections with a relatively low source impedance as compared to that for another value of said third test signal; and extracting test results as converted to serial form from said second external connection on the packaged electronics system.

5. Apparatus as set forth in claim 1 wherein said means for converting the signals appearing in parallel from at least one end of each said interconnection bus, converts the signals at the ends of said interconnection busses connecting during normal operation to ports of said portions of said packaged electronics system.

6. Apparatus as set forth in claim 1 wherein said means for converting the signals appearing in parallel from at least one end of each said interconnection bus, converts the signals at the ends of said interconnection busses connecting during normal operation to input ports of said portions of said packaged electronics system.

7. Apparatus as set forth in claim 1 wherein said means for converting the signals appearing in parallel from at least one end of each said interconnection bus, converts the signals at the ends of said interconnection busses connecting directly from the output connections of said sets of tristate drivers.

8. Apparatus for testing a packaged electronics system, as set forth in claim 7 in combination with said electronics system, wherein said respective portions of said packaged electronics system are each constructed within the confines of a respective integrated circuit chip; and together with each first and second set of transmission gates associated with an input port thereof, together with each set of tristate drivers associated with an output port thereof; together with a respective first shift register, included within said means for converting the signals appearing in parallel form at least one end of each said interconnection bus to a sequence of test results as converted to serial form, in cascade connection with the first shift registers of others of said integrated circuit chips; and together with a respective second shift register included within said means for converting test vectors supplied in serial form to test vectors in parallel form, by cascade connection with the second shift registers of others of said integrated circuit chips.

9. Apparatus for testing a packaged electronics system, as set forth in claim 8, operated in accordance with a non-testing mode of normal operation of at least selected portions of said packaged electronics system, said method comprising the steps of:

applying a respective value of said first test signal as conditions each first set of transmission gates associated with the input port of each normally operated portion of said packaged electronics system for conditioning each said first set of transmission gates to connect that input port to each of said interconnection bus connecting thereto during times of normal operation;

applying a respective value of said second test signal as conditions each second set of transmission gates associated with the input port of each normally operated portion of said packaged electronics system for disconnecting that input port for receiving test vectors from said means for converting said test vectors; and applying a respective value of said third test signal as conditions each set of tristate drivers associated with an output port of each normally operated portion of said packaged electronics system to apply the signal received at its input connections with relatively low source impedance as compared to that for another value of said third test signal.

10. Apparatus for testing a packaged electronics system, as set forth in claim 8, operated in accordance with a method to test the functioning of a portion of the packaged electronics system, said method comprising the steps of:

loading a plurality m in number of n-bit-long test vectors serially, via said first external connection on the packaged electronics system, into said means for converting said test vectors supplied in serial form to test vectors in parallel form;

applying a value of said first test signal as conditions said first set of transmission gates associated with an input port of said portion of said packaged electronics system under test for disconnecting that said input port from each said interconnection bus connecting thereto during times of normal operation;

applying a value of said second test signal as conditions said second set of transmission gates associated with an input port of said portion of said packaged electronics system under test for connecting that said input port to receive said test vectors in parallel form as supplied by said means for converting test vectors in serial form to test vectors in parallel form;

applying a value of said third test signal as conditions said set tristate drivers associated with an output port of said portion of said packaged electronics system under test to apply the signal received at its input connections to its output connections with a relatively low source impedance as compared to that for another value of said third test signal; and extracting test results as converted to serial form from said second external connection on the packaged electronics system.

11. A packaged electronics system including interconnection busses for connecting portions of said system to each other and apparatus for testing said system, operated in accordance with a method to test the interconnections between first and second ones of said portions of the packaged electronics system, said respective portions of said system each having a respective input port and respective output port to each of which ports one end of each of certain of those said interconnection busses connects during times of normal operation, said apparatus for testing comprising:

a first external connection on the packaged electronics system for receiving in serial form binary data descriptive of a plurality m in number of n-bit long test vectors, wherein m is an integer greater than one and wherein n is an integer greater than one that is not necessarily the same as or different from m;

means included within said packaged electronics system for converting said test vectors, as received through said first external connection in serial form, to test vectors in parallel form for each said input port, which said means includes a respective first shift register associated with each said input port of a respective portion of said system and located with said respective portion of said system on the same integrated circuit chip, each said first shift register having a serial input port connected from said first external connection on the system through which said first shift register can be serially loaded to store temporarily therewithin at the same time m n-bit-long test vectors, each said first shift register having a parallel output port for successively supplying said n-bit long test vectors stored temporarily therewithin;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

exclusive means included within said packaged electronics system for applying said n-bit-wide test vectors in parallel form, in which means said n-bit-wide test vectors are applied in parallel form only via a respective second set of transmission gates associated with each said input port responding to a second test signal for selectively connecting that said input port to receive test vectors from said means for converting each of said n-bit-long test vectors supplied in serial form to n-bit-wide test vectors in parallel form;

a respective set of tristate drivers associated with each said output port, having input connections exclusively from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting to a sequence of said test results supplied in serial form the signals appearing in parallel from at the ends of said interconnection busses connecting directly from the output connections of said sets of tristate drivers; and a second external connection on the packaged electronics system for transmitting therethrough said sequence of said test results in serial form said method comprising the steps of:

loading binary data descriptive of a plurality m in number of n-bit-long test vectors serially, via said first external connection on the packaged electronics system, into said means for converting said test vectors supplied in serial form to test vectors in parallel form;

applying a respective value of said first test signal as conditions said first set of transmission gates associated with an input port of said second portion of said packaged electronics system under test for connecting that said input port to each said interconnection bus connecting thereto during times of normal operation;

applying a respective value of said second test signal as conditions said second set of transmission gates associated with an input port of said second portion of said packaged electronics system for connecting that said input port to receive said test vectors in parallel form as supplied by said means for converting test vectors in serial form to test vectors in parallel form;

applying a value of said third test signal as conditions said set of tristate drivers associated with an output port of each said portion of said packaged electronics system connecting to the input port of said second portion of said packaged electronics system to apply the signal received at its input connections to its output connections with a relatively high source impedance as compared to that for another value of said third test signal; and extracting from said second external connection on the packaged electronics system the test results from the output connections of said set of tristate drivers of said first portion of said packaged electronics system as converted to serial form.

12. A packaged electronics system including interconnection busses for connecting portions of said system to each other and apparatus for testing said system, operated in accordance with a method to test the interconnections between first and second ones of said portions of the packaged electronics system, said respective portions of said system each having a respective input port and respective output port to each of which ports one end of each of certain of those said interconnection busses connects during times of normal operation, said apparatus for testing comprising;

a first external connection on the packaged electronics system receiving therethrough test vectors supplied in serial form to the packaged electronics system, said test vectors each being n bits long with n being a positive integer greater than one;

means included within said packaged electronics system for converting said test vectors supplied in serial form, as received through said first external connection, to test vectors in parallel form for each said input port, said test vectors each being n bits long with n being a positive integer greater than one;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting each of said n-bit-long test vectors supplied in serial form to n-bit-wide test vectors in parallel form;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting, to a sequence of said test results supplied in serial form, the signals appearing in parallel from at least one end of each said interconnection bus; and a second external connection on the packaged electronics system for transmitting therethrough said sequence of said test results in serial form said method comprising the steps of:

loading a number of n-bit-long test vectors serially, via said first external connection on the packaged electronics system, into said means for converting said test vectors supplied in serial form to test vectors in parallel form;

applying a respective value of said first test signal as conditions each first set of transmission gates associated with an input port of said second portion of said packaged electronics system under test for connecting that said input port to each said interconnection bus connecting thereto during times of normal operation;

applying a respective value of said second test signal as conditions said second set of transmission gates associated with the input port of said second portion of said packaged electronics system for connecting that said input port to receive said test vectors in parallel form as supplied by said means for converting test vectors in serial form to test vectors in parallel form;

applying a value of said third test signal as conditions said set tristate drivers associated with an output port of each said portion of said packaged electronics system connecting to the input port of said second portion of said packaged electronics system to apply the signal received at its input connections to its output connections with a relatively high source impedance as compared to that for another value of said third test signal; and extracting from said second external connection on the packaged electronics system the test results from the output connections of said set of tristate drivers of said first portion of said packaged electronics system as converted to serial form.

13. A packaged electronics system including interconnection busses for connecting portions of said system to each other and apparatus for testing said system, operated in accordance with a method to test the interconnections between first and second ones of said portions of the packaged electronics system, said respective portions of said system each having a respective input port and respective output port to each of which ports one end of each of certain of those said interconnection busses connects during times of normal operation, said apparatus for testing comprising:

a first external connection on the packaged electronics system receiving therethrough test vectors supplied in serial form to the packaged electronics system, said test vectors each being n bits long with n being a positive integer greater than one;

means included within said packaged electronics system for converting said test vectors supplied in serial form, as received through said first external connection, to test vectors in parallel form for each said input port, said test vectors each being n bits long with n being a positive integer greater than one;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting each of said n-bit-long test vectors supplied in serial form to n-bit-wide test vectors in parallel form;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting, to a sequence of said test results supplied in serial form, the signals appearing in parallel from at least one end of each said interconnection bus; and a second external connection on the packaged electronics system for transmitting therethrough said sequence of said test results in serial form said method comprising the steps of:

loading a number of n-bit-long test vectors serially, via said first external connection on the packaged electronics system, into said means for converting said test vectors supplied in serial form to test vectors in parallel form, one of said n-bit vectors being such as to cause a selected one of the bit positions of the output port of said first portion of said packaged electronics system to be logic ONE and to cause the other of the bit positions of the output port of said first portion of said packaged electronics system to be logic ZERO, and another of said n-bit vectors being such as to cause a selected one of the bit positions of the output port of said first portion of said packaged electronics system to be logic ZERO and to cause the others of the bit positions of the output port of said first portion of said packaged electronics system to be logic ONE;

applying respective values of said first and second test signals to said first portion of said packaged electronics system under test for rendering its first and secnd sets of transmissin gates respectively non-transmissive and transmissive, thereby connecting the input port of said first portion of said packaged electronics system to receive said test vectors in parallel form as supplied by said means for converting test vectors in serial form to test vectors in parallel form, and disconnecting that said input port from each said interconnection bus connecting thereto during times of normal operation; rendering its first and second sets of transmission gates respectively transmissive and non-transmissive, thereby connecting the input port of said second portion of said packaged electronics system from each said interconnection bus connecting thereto from the output port of said first portion of said packaged electronics system during times of normal operation, and disconnecting that said input port from receiving said test vectors in parallel form as supplied by said means for converting test vectors in serial form to test vectors in parallel form;

applying a value of said third test signal as conditions said set of tristate drivers associated with an output port of each said first portion of said packaged electronics system under test to apply the signal received at its input connections to its output connections with a relatively low source impedance as compared to that for another value of said third test signal; and extracting from said second external connection on the packaged electronics system the test results from the output connections of said set of tristate drivers of said second portion of said packaged electronics system as converted to serial form.

14. A packaged electronics system including interconnection busses for connecting portions of said system to each other and apparatus for testing said system, operated in accordance with a method to test the interconnections between first and second ones of said portions of the packaged electronics system, said respective portions of said system each having a respective input port and respective output port to each of which ports one end of each of certain of those said interconnection busses connects during times of normal operation, said apparatus for testing comprising:

a first external connection on the packaged electronics system for receiving therethrough test vectors supplied in serial form to the packaged electronics system;

means included within said packaged electronics system for converting said test vectors supplied in serial form, as received through said first external connection, to test vectors in parallel form for each said input port, which said means is of a type that can be loaded to store temporarily therewithin at the same time m n-bit-long test vectors for each said input port, wherein m is an integer greater than one and wherein n is an integer greater than one that is not necessarily the same as or different from m;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting each of said n-bit-long test vectors supplied in serial form to n-bit-wide test vectors in parallel form;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting, to a sequence of said test results supplied in serial form, the signals appearing in parallel from at the ends of said interconnection busses connecting directly from the output connections of said sets of tristate drivers; and a second external connection on the packaged electronics system for transmitting therethrough said sequence of said test results in serial form said method comprising the steps of:

loading a plurality m in number of n-bit-long test vectors serially, via said first external connection on the packaged electronics system, into said means for converting said test vectors supplied in serial form to test vectors in parallel form;

applying a respective value of said first test signal as conditions said first set of transmission gates associated with an input port of said second portion of said packaged electronics system under test for connecting that said input port to each said interconnection bus connecting thereto during times of normal operation;

applying a respective value of said second test signal as conditions said second set of transmission gates associated with the input port of said second portion of said packaged electronics system for connecting that said input port to receive said test vectors in parallel form as supplied by said means for converting test vectors in serial form to test vectors in parallel form;

applying a value of said third test signal as conditions said set of tristate drivers associated with an output port of each said portion of said packaged electronics system connecting to the input port of said second portion of said packaged electronics system to apply the signal received at its input connections to its output connections with a relatively high source impedance as compared to that for another value of said third test signal; and extracting from said second external connection on the packaged electronics system the test results from the output connections of said set of tristate drivers of said first portion of said packaged electronics system as converted to serial form.

15. A packaged electronics system including interconnection busses for connecting portions of said system to each other and apparatus for testing said system, operated in accordance with a method to test the interconnections between first and second ones of said portions of the packaged electronics system, said respective portions of said system each having a respective input port and respective output port to each of which ports one end of each of certain of those said interconnection busses connects during times of normal operation, said apparatus for testing comprising:

a first external connection on the packaged electronics system for receiving therethrough test vectors supplied in serial form to the packaged electronics system;

means included within said packaged electronics system for converting said test vectors supplied in serial form, as received through said first external connection, to test vectors in parallel form for each said input port, which said means is of a type that can be loaded to store temporarily therewithin at the same time m n-bit-long test vectors for each said input port, wherein m is an integer greater than one and wherein n is an integer greater than one that is not necessarily the same as or different from m;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting each of said n-bit-long test vectors supplied in serial form to n-bit-wide test vectors in parallel form;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting, to a sequence of said test results supplied in serial form, the signals appearing in parallel from at the ends of said interconnection busses connecting directly from the output connections of said sets of tristate drivers; and a second external connection on the packaged electronics system for transmitting therethrough said sequence of said test results in serial form said method comprising the steps of:

loading a number of n-bit-long test vectors serially, via said first external connection on the packaged electronics system, into said means for converting said test vectors supplied in serial form to test vectors in parallel form, one of said n-bit vectors being such as to cause a selected one of the bit positions of the output port of said first portion of said packaged electronics system to be logic ONE and to cause the others of the bit positions of the output port of said first portion of said packaged electronics system to be logic ZERO, and another of said n-bit vectors being such as to cause a selected one of the bit positions of the output port of said first portion of said packaged electronics system to be logic ZERO and to cause the others of the bit positions of the output port of said first portion of said packaged electronics system to be logic ONE;

applying respective values of said first and second test signals to said first portion of said packaged electronics system under test for rendering its first and second sets of transmission gates respectively non-transmissive and transmissive, thereby connecting the input port of said first portion of said packaged electronics system to receive said test vectors in parallel form as supplied by said means for converting test vectors in serial form to test vectors in parallel form, and disconnecting that said input port from each said interconnection bus connecting thereto during times of normal operation;

applying respective values of said first and second test signals to said second portion of said packaged electronics system under test for rendering its first and second sets of transmission gates respectively transmissive and non-transmissive, thereby connecting the input port of said second portion of said packaged electronics system from each said interconnection bus connecting thereto from the output port of said first portion of said packaged electronics system during times of normal operation, and disconnecting that said input port from receiving said test vectors in parallel form as supplied by said means for converting test vectors in serial form to test vectors in parallel form;

applying a value of said third test signal as conditions said set of tristate drivers associated with an output port of each said first portion of said packaged electronics system to apply the signal received at its input connections to its output connections with a relatively low source impedance as compared to that for another value of said third test signal; and extracting from said second external connection on the packaged electronics system the test results from the output connections of said set of tristate drivers of said second portion of said packaged electronics system as converted to serial form.

16. Apparatus for testing a packaged electronics system having respective portions each having a respective input port and respective output port, said electronics system further including interconnection busses for connecting between certain of the ports of the portions of said electronics system to which the ends of those busses connect during times of normal operation, said input ports considered together having a cumulative bit width of n bits, wherein n is an integer greater than one, said apparatus for testing comprising:

a first external connection on the packaged electronics system for receiving therethrough test vectors supplied in serial form;

means included within said packaged electronics system for converting said test vectors supplied in serial form, as received through said first external connection during a time interval preceding a testing time interval, to n-bit-wide test vectors supplied in parallel form during said testing time interval, said means for converting said test vectors supplied in serial form to test vectors in parallel form being of a type that can be loaded during said preceding time interval to store temporarily therewithin at the same time m n-bit-wide test vectors and that can be unloaded during said testing time interval to supply said m n-bit-wide test vectors one after the other, wherein m is an integer greater than one that is not necessarily the same as or different from n;

a respective first set of transmission gates associated with each said input port responding to a first test signal for selectively disconnecting that said input port from said interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting said test vectors supplied in serial form to n-bit-wide test vectors supplied in parallel form, said second set of transmission gates providing for signal transmission therethrough in either direction;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting the signals appearing in parallel form at the ends of said interconnection busses connecting directly from the output connections of sets of tristate drivers to a sequence of said test results supplied in serial form; and a second external connection on the packaged electronics system for transmitting therethrough said sequence of said test results in serial form.

17. Apparatus for testing a packaged electronics system having respective portions each having a respective input port and respective output port, said electronics system further including interconnection busses for connecting between certain of the ports of the portions of said electronics system to which the ends of those busses connect during times of normal operation, said input ports considered together having a cumulative bit width of n bits, wherein n is an integer greater than one, said apparatus for testing comprising:

a first external connection on the packaged electronics system for receiving therethrough test vectors supplied in serial form;

means included within said packaged electronics system for converting said test vectors supplied in serial form, as received through said first external connection during a time interval preceding a testing time interval, to test vectors in parallel form for each said input port during said testing time interval, said means for converting said test vectors supplied in serial form to test vectors in parallel form being of a type that can supply a succession of those temporarily stored n-bit-long test vectors during said testing interval, m and n each being positive plural integers not necessarily the same as or different from each other;

a respective first set of transmission gates associated with each said input port responding to a first test signal for selectively disconnecting that said input port from aid interconnection busses connecting thereto during times of normal operation, said first set of transmission gates providing for signal transmission therethrough in either direction;

a respective second set of transmission gates associated with each said input port responding to a second test signal for selectively connecting that said input port to receive test vectors from said means for converting test vectors supplied in serial form to test vectors in parallel form, said second set of transmission gates providing for signal transmission therethrough in either direction;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting the signals appearing in parallel form at the ends of those interconnection busses connecting during normal operation to input ports of said portions of said packaged electronics system to a sequence of said test results supplied in serial form; and a second external connection on the packaged electronics system for transmitting therethrough said sequence of said test results in serial form.

18. Apparatus for testing a packaged electronics system having respective portions each having a respective input port and respective output port, said electronics system further including interconnection busses for connecting between certain of the ports of the portions of said electronics system to which the ends of those busses connect during times of normal operation, said input ports considered together having a cumulative bit width of n bits, wherein n is an integer greater than one, said apparatus for testing comprising:

a first external connection on the packaged electronics system for receiving therethrough test vectors supplied in serial form;

means included within said packaged electronics system for converting said test vectors supplied in serial form, as received through said first external connection during a time interval preceding a testing time interval, to test vectors in parallel form for each said input port during said testing time interval, said means for converting said test vectors supplied in serial form to test vectors in parallel form being of a type that can temporarily store m n-bit-long test vectors at a time and that can supply a succession of those temporarily stored n-bit-wide test vectors during said testing interval, m and n each being positive plural integers not necessarily the same as or different from each other;

a respective first set of transmission gates associated with each said input port responding to a first test signal for selectively disconnecting that said input port from aid interconnection busses connecting thereto during times of normal operation, and first set of transmission gates providing for signal transmission therethrough in either direction;

a respective second set of transmission gates associated with each said input port responding to a second test signal for selectively connecting that said input port to receive test vectors from said means for generating test vectors, said second set of transmission gates providing for signal transmission therethrough in either direction;

a respective set of tristate drivers associated with each said output port, having input connections from that said output port and having output connections to each of the interconnection busses connecting therefrom during normal operation and providing the sole means for connecting that said output port to these interconnection busses during normal operation, each said respective set of tristate drivers applying the signal received at its input connections to its output connections with a source impedance controlled by a third test signal;

means included within said packaged electronics system for converting the signals appearing in parallel form from all ends of those interconnection busses connecting during normal operation to ports of said portions of said packaged electronics system to a sequence of said test results supplied in serial form; and a second external connection on the packaged electronics system for transmitting therethrough said sequence of said test results in serial form.

* * * * *